United States Patent
Xu

(10) Patent No.: US 8,597,995 B2
(45) Date of Patent: Dec. 3, 2013

(54) METAL GATE DEVICE WITH LOW TEMPERATURE OXYGEN SCAVENGING

(75) Inventor: Jeff J. Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 123 days.

(21) Appl. No.: 13/244,358

(22) Filed: Sep. 24, 2011

(65) Prior Publication Data

US 2013/0078779 A1 Mar. 28, 2013

(51) Int. Cl.
*H01L 21/8238* (2006.01)

(52) U.S. Cl.
USPC .................................. 438/216; 257/E21.639

(58) Field of Classification Search
USPC .................. 438/222, 226, 413, 926, 976; 257/E21.638
See application file for complete search history.

(56) References Cited

U.S. PATENT DOCUMENTS

| 6,087,231 A * | 7/2000 | Xiang et al. ............... 438/287 |
| 6,465,309 B1 * | 10/2002 | Xiang et al. ............... 438/299 |
| 2012/0280288 A1 * | 11/2012 | Ando et al. ............... 257/288 |

* cited by examiner

*Primary Examiner* — Chandra Chaudhari
(74) *Attorney, Agent, or Firm* — Haynes and Boone, LLP

(57) ABSTRACT

A semiconductor device with a metal gate is disclosed. The device includes a semiconductor substrate, source and drain features on the semiconductor substrate, and a gate stack over the semiconductor substrate and disposed between the source and drain features. The gate stack includes an interfacial layer (IL) layer, a high-k (HK) dielectric layer formed over the semiconductor substrate, an oxygen scavenging metal formed on top of the HK dielectric layer, a scaling equivalent oxide thickness (EOT) formed by using a low temperature oxygen scavenging technique, and a stack of metals gate layers deposited over the oxygen scavenging metal layer.

20 Claims, 14 Drawing Sheets

METAL GATE DEVICE WITH LOW TEMPERATURE OXYGEN SCAVENGING

BACKGROUND

When a semiconductor device such as a metal-oxide-semiconductor field-effect transistor (MOSFET) is scaled down through various technology nodes, several techniques have been employed to improve device performance. One technique is a high-k (HK) dielectric material and metal gate (MG) scheme. Another example is to use a strained-semiconductor substrate. In implementing a HK/MG scheme, it is important to properly scale an equivalent oxide thickness (EOT), such as by using oxygen scavenging metal technique. Such techniques use a high temperature process to trigger the oxygen scavenging effect. It is desired to provide additional improvements to such techniques.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

SUMMARY

One of the broader forms of the present disclosure involves a process of fabricating a semiconductor device with a metal gate. An exemplary semiconductor device includes a semiconductor substrate, an interfacial layer (IL), a HK dielectric layer formed over the semiconductor substrate, an oxygen scavenging metal layer formed on top of the HK dielectric layer, scale equivalent oxide thickness (EOT) by using a low temperature oxygen scavenging technique, and a stack of metals gate layers deposited over the oxygen scavenging metal layer.

Another one of the broader forms of the present disclosure involves a process of fabricating a semiconductor device with a metal gate that includes a semiconductor substrate, an IL formed over the semiconductor substrate, a HK dielectric layer formed over the IL, depositing an oxygen scavenging metal layer over the HK layer, scaling EOT by using the low temperature oxygen scavenging, depositing a dummy gate layer over the oxygen scavenging metal layer, forming a dummy gate structure, forming spacers along the dummy gate sidewalls, forming source and drain regions aligned with the dummy gate structure, removing the dummy gate structure resulting in a gate trench and forming a stack of metal gate layers in the gate trench.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

A HK Last/MG Last Process Scheme

Figure 1:
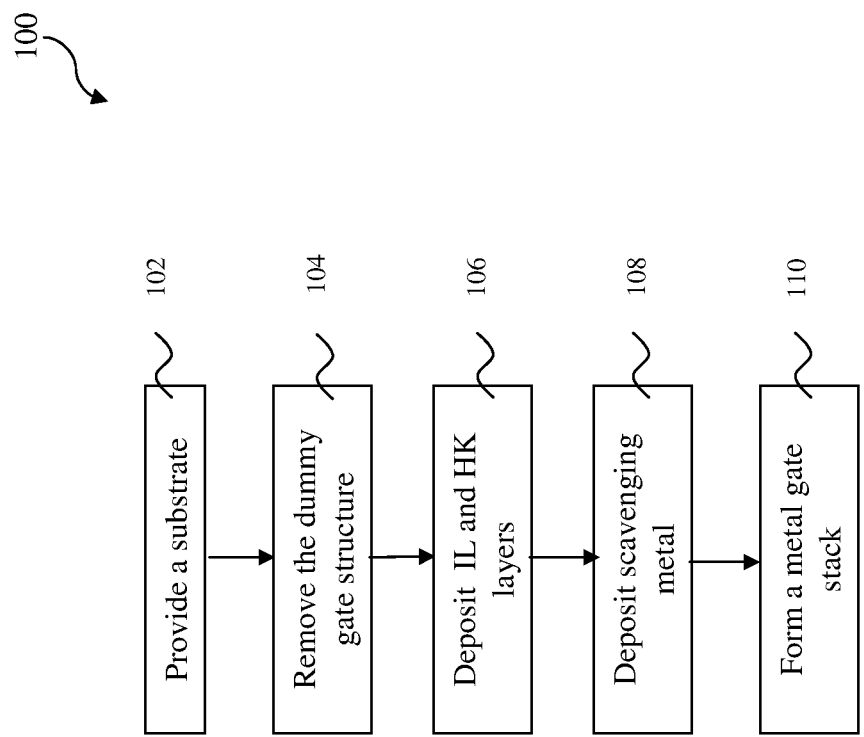
FIG. 1 is a flowchart of an example method for making a semiconductor device having a HK last/metal gate (MG) last structure constructed according to various aspects of the present disclosure.

FIG. 1 is a flowchart of one example embodiment of a method 100 for making a semiconductor device having a HK/MG stack with EOT scaling constructed according to various aspects of the present disclosure. The method 100 is described with reference to FIGS. 2 through 8. A HK last/MG last process scheme means that a HK layer and a metal gate are formed after high temperature processes have been applied in formations of, such as source and drain regions.

The method 100 begins at step 102 by providing a semiconductor substrate 210. The substrate 210 includes silicon. Alternatively, the substrate may include germanium, silicon germanium, gallium arsenide or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and materials.

Figure 2:
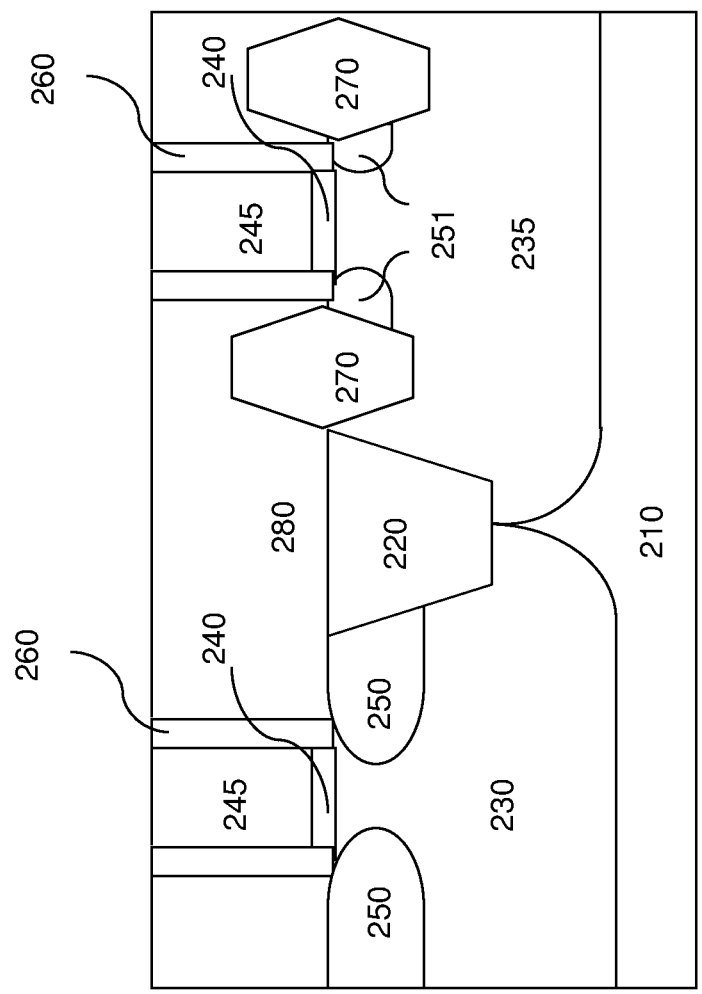
FIGS. 2 to 8 are cross-sectional views of an example embodiment of a semiconductor device having a HK last/MG last structure at fabrication stages constructed according to the method of FIG. 1.

In FIG. 2, the substrate 210 also includes various isolation features and the isolation features may include different structures and can be formed using different processing technologies. For example, an isolation feature may include shallow trench isolation (STI) feature 220. The formation of STI may include etching a trench (not shown) in substrate 210 and filling the trench by insulator materials such as silicon oxide, silicon nitride, or silicon oxynitride. The filled trench may have a multi-layer structure such as a thermal oxide liner layer with silicon nitride filling the trench. As an example, the STI structure may be created using a process sequence such as:

growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back excessive oxide.

Continuing with FIG. 2, various doped regions such as a P-well 230 and an N-well 235 are formed by implantation techniques. A portion of the substrate 210 is doped P-type and forms the P-well 230 where an n-channel device will be fabricated. Similarly, a portion of the substrate 210 is doped N-type and forms the N-well 235 where a p-channel device will be fabricated. The doped regions are doped with P-type dopants, such as boron or BF2, and/or N-type dopants, such as phosphorus or arsenic. The doped regions may be formed directly on the substrate 210, in a P-well structure, in an N-well structure, in a dual-well structure, or using a raised structure.

A dummy oxide layer 240, such as SiO2 or SiON, is disposed over the substrate 210 by thermal oxidation, chemical oxidation, CVD, ALD or any appropriate method. Thereafter, a dummy gate layer 245, such as a polysilicon layer, is disposed over the dummy oxide layer 240 layer by deposition techniques. Alternatively, an amorphous silicon layer may optionally be formed instead of the polysilicon layer. The dummy oxide layer 240 and the dummy gate layer 245 are patterned to form a dummy gate stack as shown in FIG. 2.

Continuing with FIG. 2, source and drain regions, 250 and 251 are formed by a proper technique, such as one or more ion implantations. The source and drain regions 250 may further include lightly doped source/drain (LDD) regions substantially aligned with the dummy gate stack and heavily doped source and drain (S/D) regions, 250 and 251, substantially aligned with associated gate sidewall spacers 260, which will be describe as below.

Gate sidewall spacers 260 are formed on the sidewalls of the dummy gate structures. The gate sidewall spacers 260 may include a dielectric material such as silicon oxide. Alternatively, the gate sidewall spacers 260 may include silicon nitride, silicon carbide, silicon oxynitride, or combinations thereof. Gate sidewall spacers 260 are formed by dielectric deposition and dry etching process. After gate sidewall spacers 260 are formed, an epitaxial growth process is used to create regions 270. For instance, an etch process may be used to recess the substrate 210, and the epitaxial growth processes may be used to grow regions 270. Regions 270 are in the PFET device and may include SiGe. However, other suitable materials may be used by different embodiments.

After formation of the source and drain (S/D) regions, 250 and 251, one or more annealing processes may be performed to activate the S/D regions. The annealing processes comprise rapid thermal annealing (RTA), laser annealing processes, or other suitable annealing processes. As an example, a high-temperature thermal annealing step that may apply temperatures anywhere in the range of 900 C-1100 C, though other embodiments may use temperatures within a different range. Further, this embodiment may include a "spike" annealing process that has a very short time duration.

Continuing with FIG. 2, an inter-layer dielectric (ILD) 280 is formed on the semiconductor substrate 210 and the dummy gate stacks. A chemical mechanical polishing (CMP) process is performed to remove excessive ILD 280 such that the dummy gate layer 245 is exposed. Additionally or alternatively, a hard mask may be formed on top of the dummy gate layer 245. The CMP process is applied to expose the hard mask and then an etching process such as a wet etch dip is applied to remove the hard mask, exposing the dummy gate layer 245.

Figure 3:
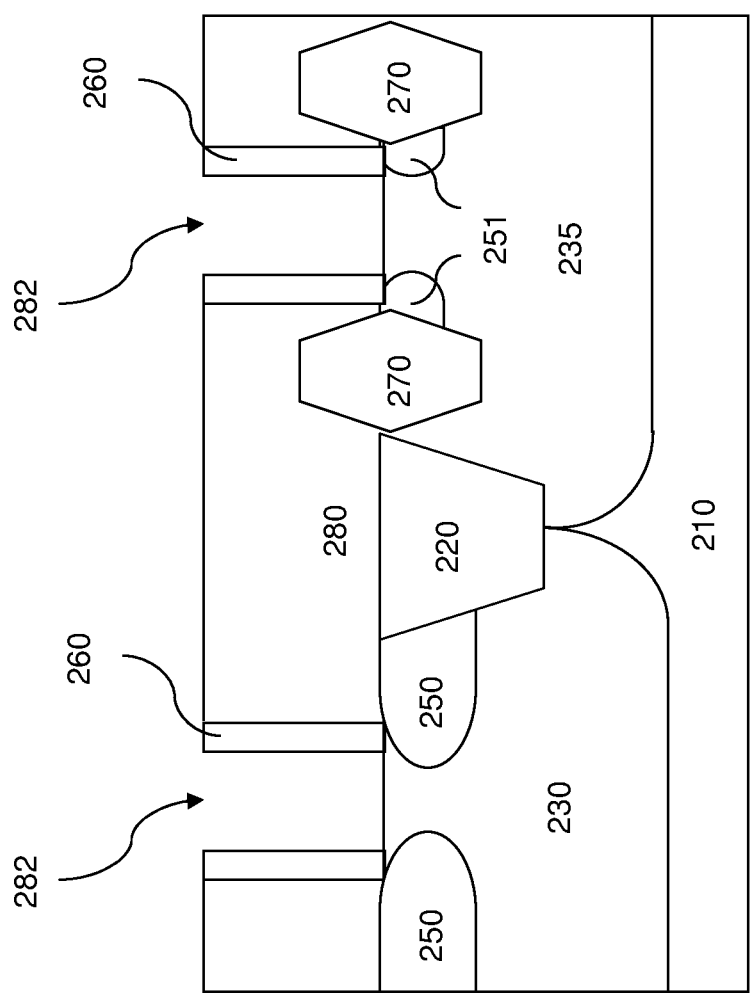

The method 100 proceeds to step 104 by applying an etching process to remove the dummy gate layer 245 in both the NFET and the PFET, forming gate trenches 282 in NFET regions and PFET regions, as shown in FIG. 3. The etch technique may include dry etch, wet etch, or a combination of dry and wet etch. The dummy oxide layer 240 may also be removed by using, e.g., HF wet etching or other suitable process after the dummy gate layer 245 is removed to expose the substrate surface.

Figure 4:
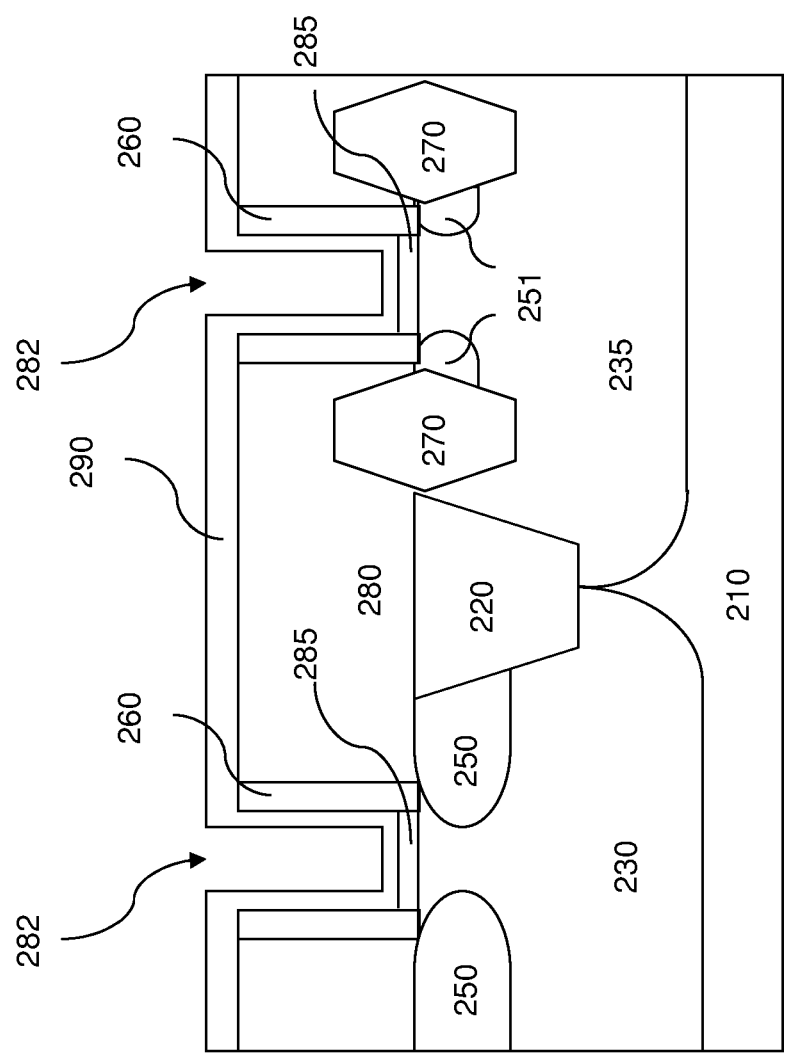

The method 100 proceeds to step 106 by depositing an interfacial layer (IL) 285 and a HK dielectric layer 290 on the gate trenches 282, as shown in FIG. 4. The IL 285 may include a silicon oxide (SiO2) layer. Alternatively, the IL 285 may optionally include HfSiO or SiON. The IL 285 may be formed by atomic layer deposition (ALD), chemical vapor deposition (CVD), thermal oxidation, wet oxidation, radical oxidation (RadOx) or combinations thereof. In the depicted embodiment, the IL 285 includes a chemical SiO2 layer with hydroxyl groups. With hydroxyl groups on the surface of the IL 285, the quality of subsequent growing oxide layer may be enhanced. The chemical SiO2 may be formed in a H2O2-containing solution, such as SC1, SC2 and SPM. The thickness of the IL 285 is about 1 nm.

Continuing with FIG. 4., the HK dielectric layer 290 may be formed over the IL 285 by ALD, CVD, metal organic CVD (MOCVD), PVD, thermal oxidation, combinations thereof, or other suitable techniques. The HK dielectric layer 290 may include a binary or ternary high-k film such as HfOx. Alternatively, the HK dielectric layer 290 may optionally include other HK dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides, or other suitable materials. In the depicted embodiment, the HK layer 290 includes HfO2 having a thickness range of 1 to 2 nm and deposited by ALD.

As an alternative example, a HKMG stack uses a SiO2 interfacial layer (IL) having about 1 nm thickness for growing an ALD high-K (HK) film. The EOT scaling of the HKMG stack may be limited by the IL with EOT of 1 nm. In order to scale EOT down to sub-0.6 nm for 22 nm technology note, the IL layer may need to be eliminated. One such IL elimination technique is a scavenging capping metal technique. The scavenging capping metal technique deposits an oxygen scavenging metal or metal compound on the HK layer. The chosen oxygen scavenging capping metal has stronger oxygen affinity than the HK layer and the IL layer. The scavenging capping metal scavenges oxygen from HK and IL at a high temperature process, such as source/drain anneal around 1000° C. and form HK/IL intermixing to scale EOT. For example, during the high temperature annealing, a HK/IL intermixing layer may formed and EOT scaling is therefore realized by zero nm IL. The HK/IL intermixing layer is usually a medium-K (K~10) silicate material such as HfSiO4 or ZrSiO4. Such approach may align with HK first scheme since HKMG stack will experience a high temperature anneal process.

Figure 5:
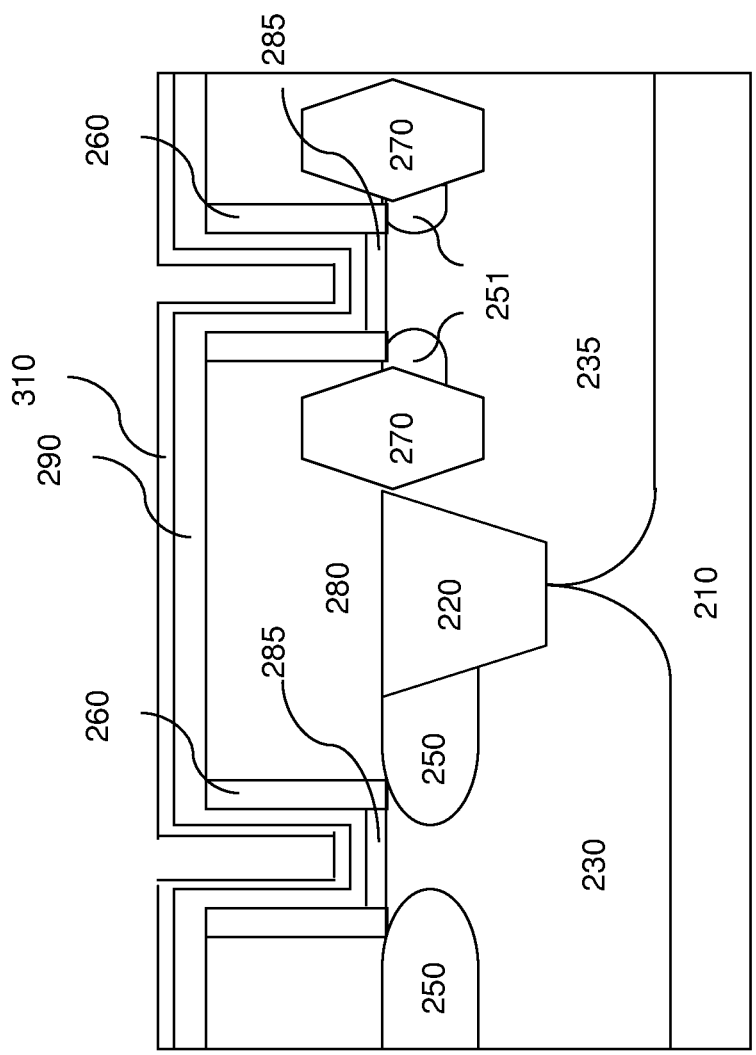
Figure 6:
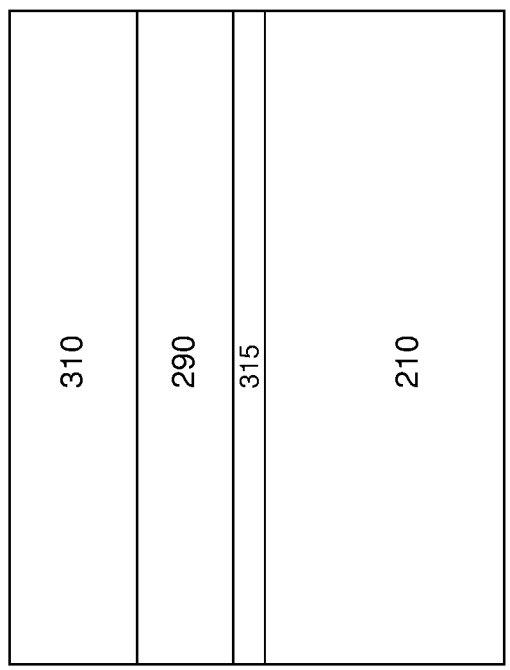
Figure 6:
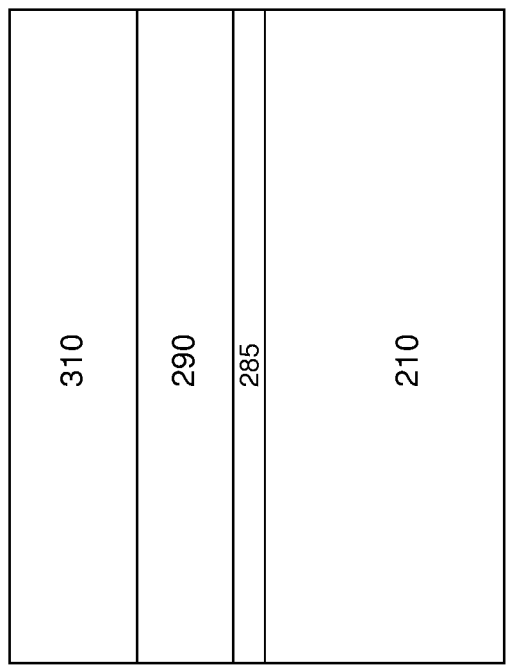
Figure 7:
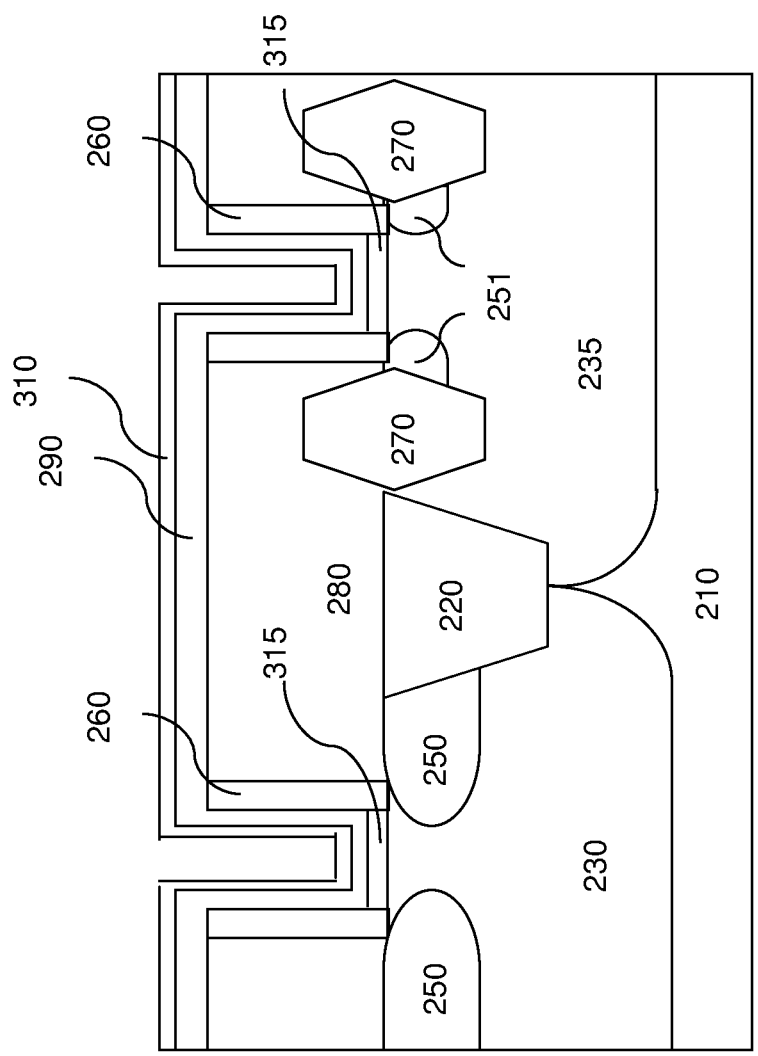

As shown in FIG. 5, the method 100 proceeds to step 108. To align with HK last process scheme, a low temperature scavenging technique, instead of using high temperature annealing process, is described in step 108. The low temperature scavenging technique is implemented by forming an oxygen scavenging metal layer 310 on the HK layer 290 with a deposition temperature range under 800 C, such as from about 20 to about 500 C. The deposition temperature plays role of triggering oxygen scavenging effect from HK/IL during the deposition process. The oxygen scavenging metal 310 may includes metal and metal compound, such as Ti, Hf, Zr, Zn, Ga, In Cr and TiN. The deposition techniques may include PVD, CVD, MOCVD or any appropriate techniques. The low temperature scavenging technique may further include vary stoichiometry of the oxygen scavenging metal compound by controlling deposition conditions, such as gas flow rate. By using the low temperature scavenging technique, an IL may be fully converted to an epitaxially growth pure Si layer 315 and a zero IL may be achieved, as shown in FIG. 6. Thus, the final EOT of the dielectric stack may be defined by the EOT of the HK layer. Further, the epitaxially growth pure Si layer 315 grows in a channel region and become a part of the channel, as shown in FIG. 7. Alternatively, the low temperature scavenging technique may convert the IL to an IL/HK intermixing layer by adjusting the oxygen scavenging metal's oxygen affinity and/or deposition temperature. As an example, the oxygen scavenging metal includes TiN formed by PVD technique at room temperature. The IL may convert to an IL/HK intermixing layer.

In the depicted embodiment, the oxygen scavenging metal 310 includes TiN by PVD techniques with around 350 C deposition temperature. In furtherance of the embodiment, the oxygen scavenging metal layer 310 includes a Ti rich TiN formed by controlling PVD deposition condition, such as N2 flow. The ratio range of Ti rich TiN is 1.2-1.8 of Ti to N. As an example, the oxygen scavenging metal layer 310 has a ratio of Ti to N around 1.5 to 1. The IL 285 may be fully converted to the epitaxially growth pure Si layer 315. A zero IL has been observed and the EOT scales to around 6.5 Å. The device electrical performance shows a well behaved C—V curve and three orders of magnitude gate leakage (Jg) reduction on Jg-CET trend. In the point of view of cost effectiveness, the low temperature scavenging technique may be realized in manufacturing production with current HKMG materials and toolset.

Figure 8:
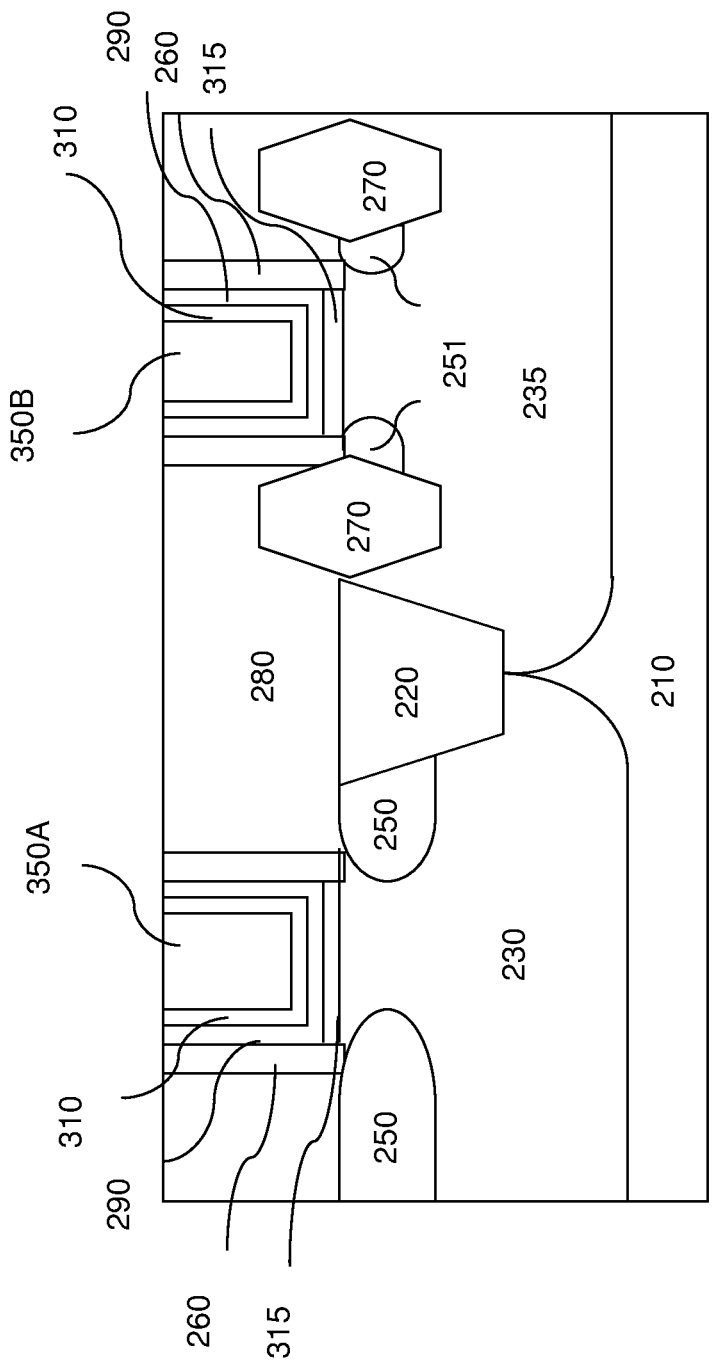

The method 100 proceeds to step 110 by forming an n-metal gate stack 350A (in the NMOS) and a p-metal gate stack 350B (in the PMOS), as shown in FIG. 8. The metal gate stacks 350A and 350B may be formed independently or simultaneously. The metal gate stack 350A and 350B may include work function (WF) layers, barrier layers, fill metal layer, liner layer, wetting layer, and adhesion layer. Further, the N-metal gate stack 350A may include a single metal layer or multi-metal layer structure with a sufficiently low EWF value such as Ti, Ag, Al, TiAlN, TaC, TaCN, TaSiN, Mn, Zr, and combinations thereof. The P-metal gate stack 350B may include a single metal layer or multi-metal layer structure with a sufficiently high effective work function (EWF) value such as TiN, TaN, Ru, Mo, Al, WN, and combinations thereof. The metal gate stacks 350A and 350B may be formed by ALD, PVD, CVD, or other suitable process. As an example, a Ti layer may be deposited to function as a wetting layer for a subsequent Al filling. The Ti layer may be formed by PVD or other suitable process. As another example, a fill metal may include Al and Al layer may be formed by CVD, PVD or other suitable technique. Alternatively, the fill metal layer may include copper (Cu) and tungsten (W).

As an example, the forming of N-type MG stack 350A may include forming a tantalum nitride (TaN) layer; and forming one of a TiAl layer and a TiAlN layer on the TaN layer. The forming of P-type MG stack 350B may include forming a tantalum nitride (TaN) layer; forming a tungsten nitride (WN) layer on the TaN layer; and forming one of a TiAl layer and a TiAlN layer on the WN layer. In one embodiment, the metal layers are deposited by using a chemical vapor deposition (CVD) process or other suitable process. By the disclosed method, the metal gate stacks for NFET and PFET are formed with different compositions and configurations. The work functions for NFET and PFET regions are tuned independently. The performances of the NMOSFET and PMOSFET are optimized and enhanced.

Continuing with FIG. 8, a chemical mechanical polishing (CMP) process may be performed on the various metal layers to planarize the NMOS and PMOS devices. The CMP process may have a high selectivity of metal layers to dielectric layer 280. The CMP process to provide a substantially planar surface for the metal gate stacks 350A, 350B and ILD layer 280, as shown in FIG. 8

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

HK First and MG Last Process Scheme

Figure 9:
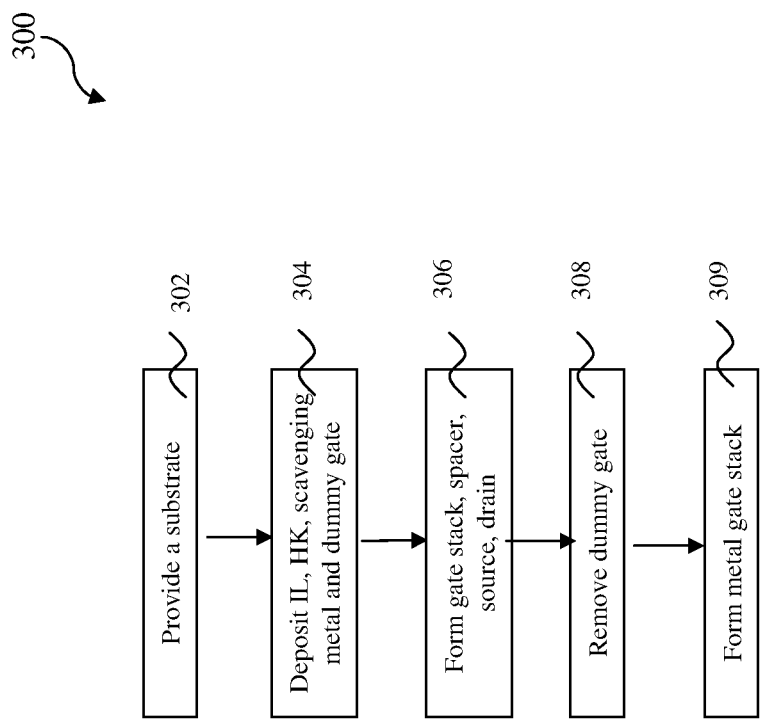
FIG. 9 is a flowchart of another example method for making a semiconductor device having a HK first/MG last structure constructed according to various aspects of the present disclosure.

FIG. 9 is a flowchart of one embodiment of an example method 300 making a semiconductor device having a HK first/MG last constructed according to various aspects of the present disclosure. The method 300 is described with reference to FIGS. 10 through 14. An HK first process means that a HK layer is formed before a formation of source and drain regions of NFET and PFET, in which a high temperature process is applied.

Figure 10:
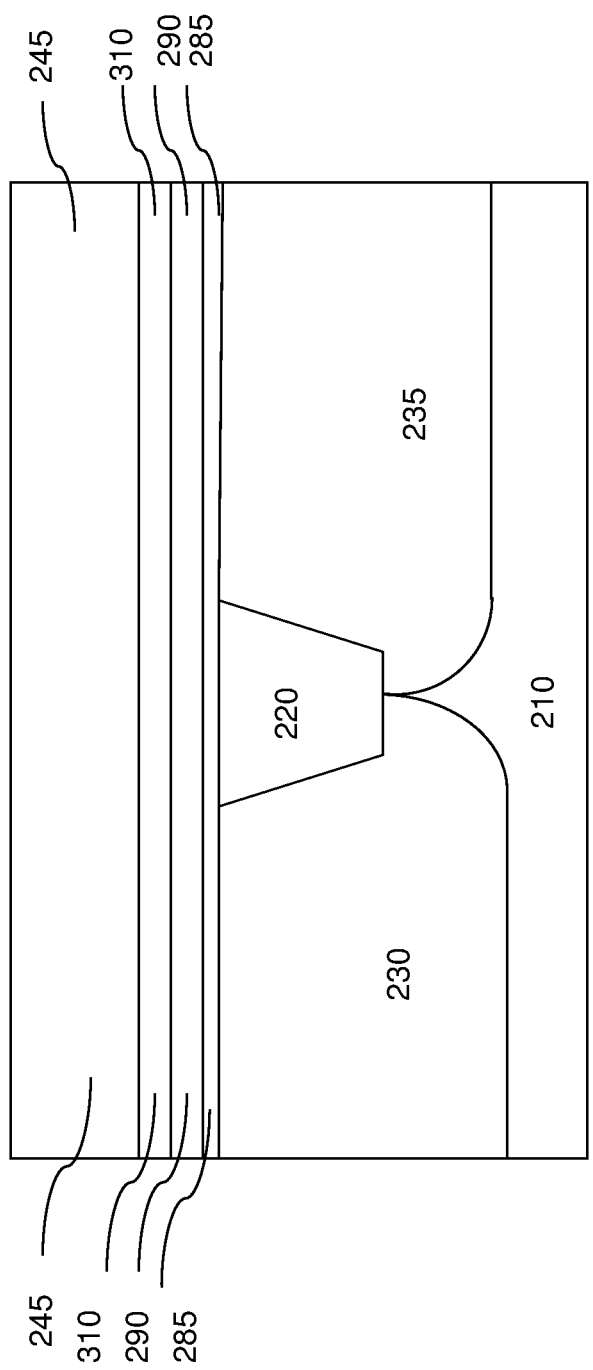
FIGS. 10 to 14 are cross-sectional views of another embodiment of a semiconductor device having HK first/MG last structure at fabrication stages constructed according to the method of FIG. 9.

The method 300 begins at step 302 by providing a semiconductor substrate 210, as shown in FIG. 10. The substrate 210 includes an STI 220, a P-well 230, and an N-well 235. A formation of the STI 220, the P-well 230 and the N-well 235 is similar in many respects to FIG. 2.

Figure 11:
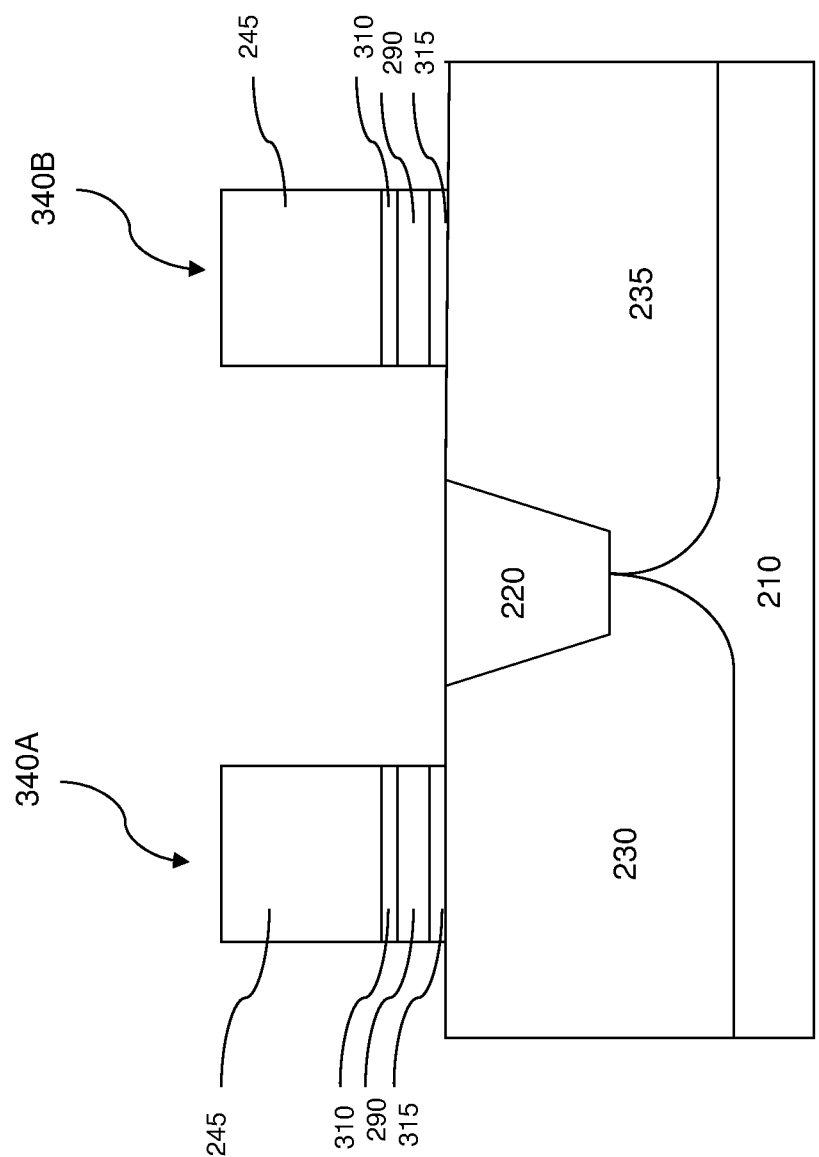

The method 300 proceeds to step 304 by depositing the IL layer 285 and HK layer 290, an oxygen scavenging metal layer 310 by using the low temperature scavenging technique, and a dummy gate layer 245 on the substrate 210, as shown in FIG. 11. A formation of the IL layer 285, the HK layer 290, the oxygen scavenging metal layer 310 and the dummy gate layer 245 is similar in many respects to FIGS. 2, 4 and 5. In the depicted embodiment, the oxygen scavenging metal 310 includes TiN by PVD techniques with around 350 C deposition temperature. In furtherance of the embodiment, the oxygen scavenging metal layer 310 includes a Ti rich TiN formed by controlling PVD deposition condition, such as N2 flow. The ratio range of Ti rich TiN is 1.2-1.8 of Ti to N. The IL 285 may be fully converted to the epitaxially growth pure Si layer 315.

The method 300 proceeds to step 306 by forming gate stacks 340A and 340B, on the substrate 210, as shown in FIG. 11. The gate stacks, 340A and 340B, include the epitaxially growth pure Si layer 315, the HK layer 290, the oxygen scavenging metal layer 310, and the dummy gate layer 245. The gate stacks, 340A and 340B, are formed by pattern and etch techniques.

Figure 12:
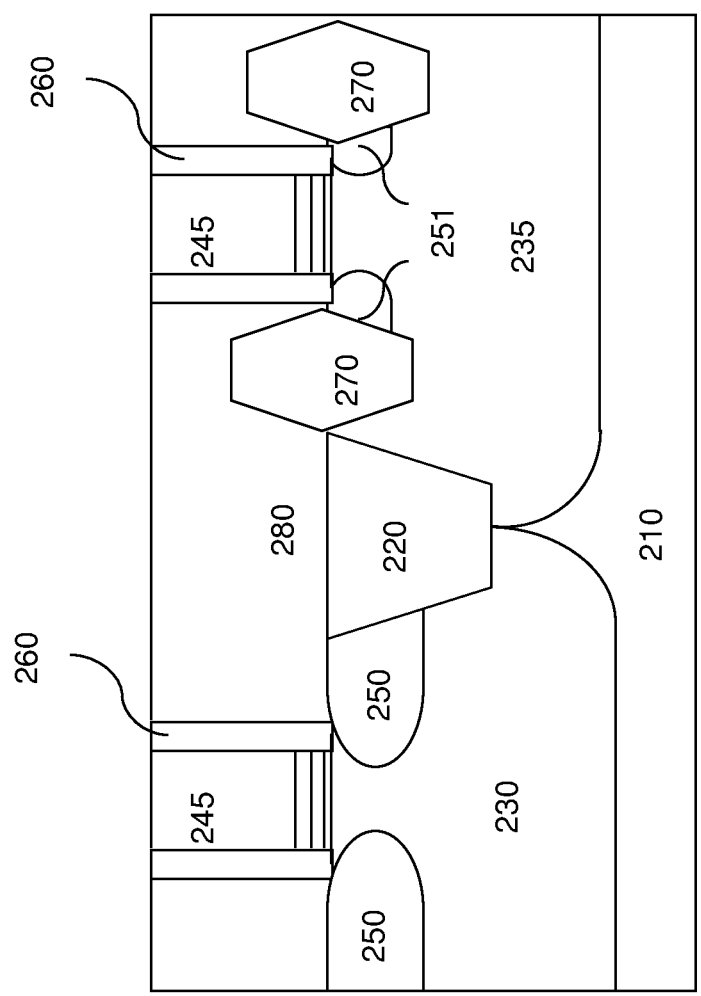

Continuing with step 306, a gate spacer 260, source/drain regions 250 of an NFET, source/drain regions 251, 270 of a PFET, and ILD layer 280 are formed, as shown in FIG. 12. The gate spacer 260, the source/drain regions 250 of the NFET, the source/drain regions 251 and 270 of the PFET, and ILD 280 are formed by techniques of depositing, etching, implant, annealing, epitaxially growth, CMP as described above with respect to the embodiment of FIG. 2.

Figure 13:
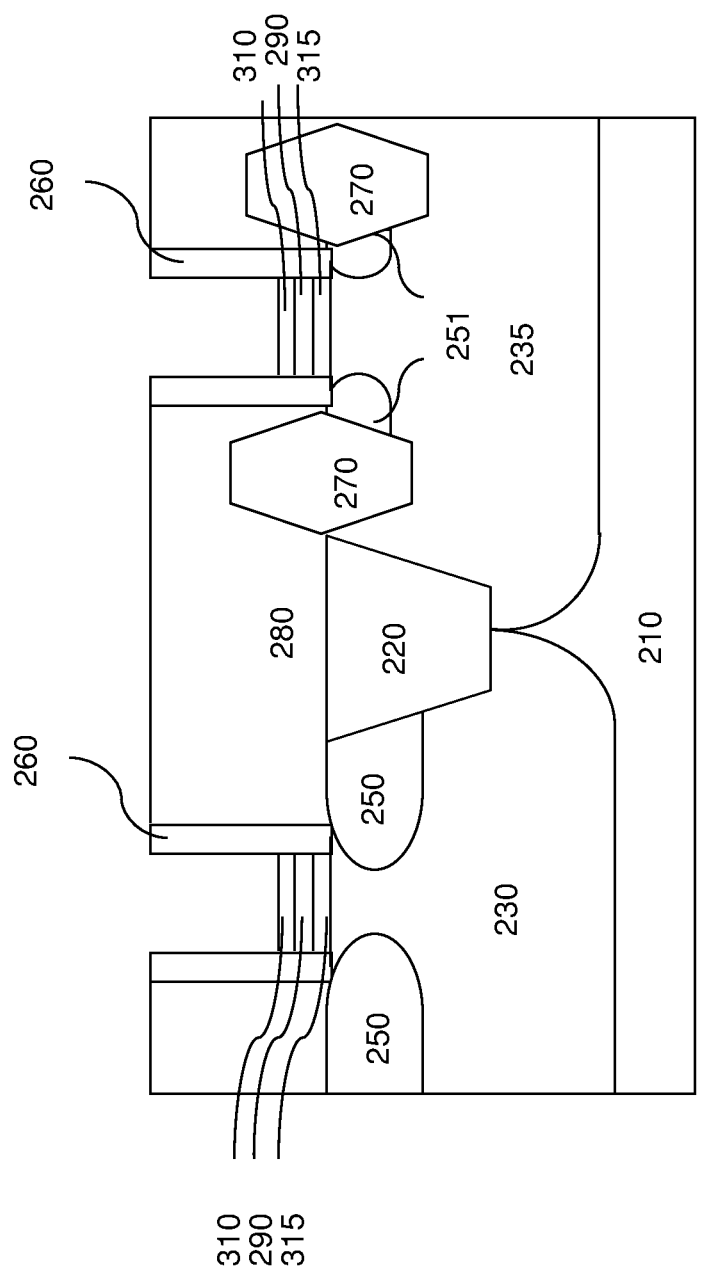

The method 300 proceeds to step 308 by removing the dummy gate layer 245 as shown in FIG. 13. The dummy gate 245 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 14:
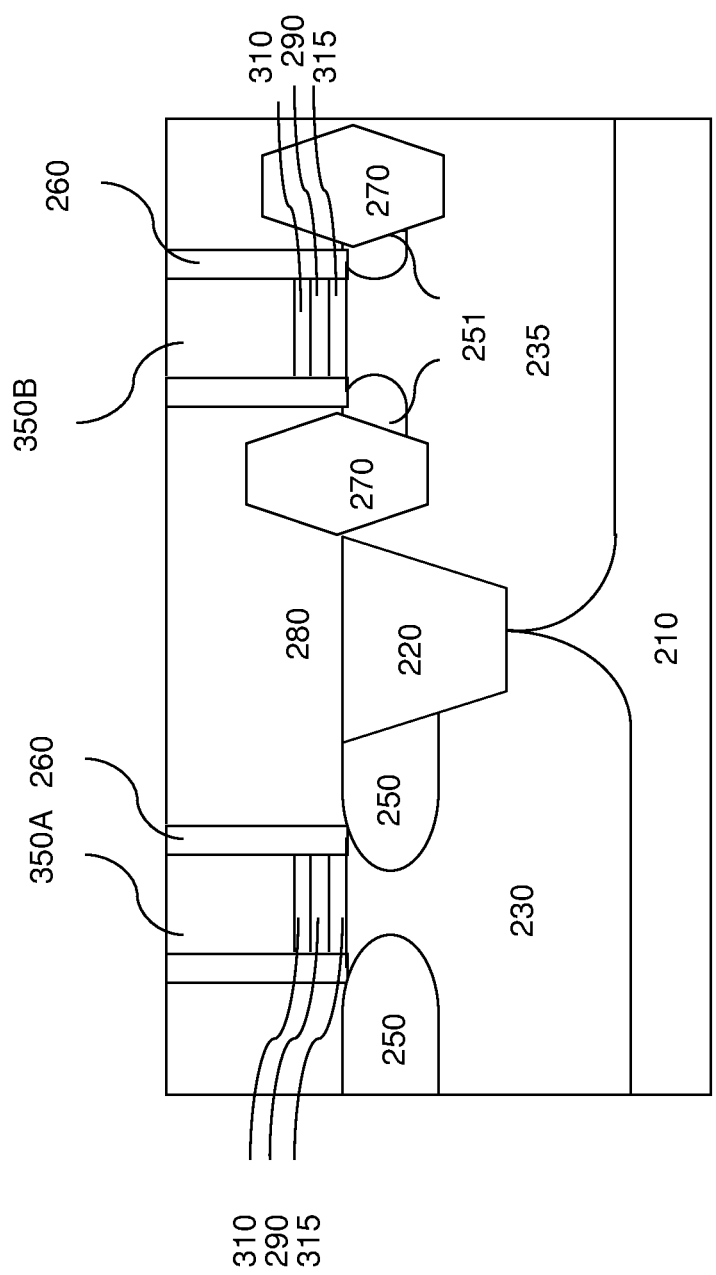

The method 300 proceeds to step 309 by forming an n-type MG stack 350A on NMOS and a p-type MG stack 350B on PMOS, as shown in FIG. 14. The formation of n-type MG stack 350A and p-type MG stack 350B as described above with respect to the embodiment of FIG. 8. A CMP is performed to planarize the NMOS and PMOS devices.

The method 300 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process of forming a semiconductor device with a metal gate stack, the process comprising:
   providing a semiconductor substrate;
   depositing an interfacial layer (IL) over the semiconductor substrate;
   depositing a high-k (HK) dielectric layer over the IL;
   scaling an equivalent oxide thickness (EOT) by depositing an oxygen scavenging metal layer on the HK dielectric layer using a low deposition temperature; and
   depositing a stack of metal gate layers over the oxygen scavenging metal layer.

2. The process of claim 1, wherein the low deposition temperature of the oxygen scavenging metal layer is in a range less than about 500 C.

3. The process of claim 2, wherein the depositing the oxygen scavenging metal layer includes a PVD process with deposition temperature range of about 20 C to about 500 C.

4. The process of claim 2, wherein the depositing the oxygen scavenging metal layer includes a CVD process with deposition temperature range of about 20 C to about 500 C.

5. The process of claim 1, wherein the oxygen scavenging metal layer includes metal compounds, and further wherein the metal compounds are formed by controlling a deposition condition.

6. The process of claim 3, wherein the oxygen scavenging metal layer includes a Ti rich TiN, and further wherein a ratio range of Ti to N is about 1.2-1.8 by controlling an N2 gas flow in the PVD process.

7. A process of forming a semiconductor device with a metal gate stack, the process comprising:
   providing a semiconductor substrate;
   depositing an interfacial layer (IL) over the semiconductor substrate;
   depositing a high-k (HK) dielectric layer over the IL;
   scaling an equivalent oxide thickness (EOT) by depositing an oxygen scavenging metal layer on the HK dielectric layer using a low deposition temperature, wherein during the oxygen scavenging metal layer deposition, the IL converts to a pure Si layer; and
   depositing a stack of metal gate layers over the oxygen scavenging metal layer.

8. The process of claim 7, wherein the pure Si layer is formed by epitaxial growth, and further wherein the epitaxially grown pure Si becomes a portion of a channel region in the semiconductor device.

9. The process of claim 1, wherein during the oxygen scavenging metal layer deposition, the IL converts to a IL/HK intermixing layer.

10. A process of forming a semiconductor device with a metal gate stack, the process comprising:
    providing a semiconductor substrate;
    forming a chemical oxide interfacial layer (IL) over the semiconductor;
    depositing a high-k (HK) dielectric layer over the chemical oxide IL;
    depositing an oxygen scavenging metal TiN layer over the HK dielectric layer with a deposition temperature range of about 20 C to about 500 C; and
    depositing a stack of metal gate layers over the oxygen scavenging metal TiN layer.

11. The process of claim 10, wherein the chemical oxide IL is formed by a H2O2-containing solution.

12. The process of claim 10, wherein the HK dielectric layer includes HfO2 formed by an ALD technique.

13. The process of claim 10, wherein the oxygen scavenging metal TiN layer is formed by a PVD technique at about 350 C deposition temperature.

14. The process of claim 13, wherein the oxygen scavenging metal TiN layer has ratio of about 1.5 N to 1 N.

15. The process of claim 10, wherein during the depositing the oxygen scavenging metal TiN layer, the chemical oxide IL converts to a pure Si layer.

16. The process of claim 15, wherein the pure Si is epitaxially grown, and further wherein the epitaxial growth of the pure Si becomes a portion of a channel region in the device.

17. The process of claim 10, wherein the oxygen scavenging metal TiN layer is deposited by a PVD technique at about room temperature.

18. The process of claim 17, wherein during the depositing the oxygen scavenging metal TiN layer, the chemical oxide IL converts to an IL/HK intermixing layer.

19. A process of forming a semiconductor device with a metal gate stack, the process comprising:
    providing a semiconductor substrate;
    depositing an interfacial layer (IL) over the semiconductor substrate;
    depositing a high-k (HK) dielectric layer over the IL;
    depositing an oxygen scavenging metal layer over the HK dielectric layer with a deposition temperature range of about 20 C to about 500 C;
    depositing a stack of metal gate layers over the oxygen scavenging metal layer.

20. The process of claim 19, further comprising:
    depositing a dummy gate layer over the oxygen scavenging metal layer;

forming a dummy gate structure;
forming spacers along sidewalls of the dummy gate structure;
forming source and drain regions aligned with the dummy gate structure;
removing the dummy gate structure resulting in a gate trench; and
depositing the stack of metal gate layers in the gate trench.

* * * * *